United States Patent
Tarui et al.

(10) Patent No.: US 9,184,307 B2
(45) Date of Patent: Nov. 10, 2015

(54) SILICON CARBIDE SEMICONDUCTOR DEVICE

(71) Applicant: Mitsubishi Electric Corporation, Tokyo (JP)

(72) Inventors: Yoichiro Tarui, Tokyo (JP); Masayuki Imaizumi, Tokyo (JP); Naoki Yutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/290,253

(22) Filed: May 29, 2014

(65) Prior Publication Data

US 2015/0060882 A1 Mar. 5, 2015

(30) Foreign Application Priority Data

Aug. 28, 2013 (JP) ................. 2013-176954

(51) Int. Cl.
| | |
|---|---|
| H01L 29/872 | (2006.01) |
| H01L 29/06 | (2006.01) |
| H01L 29/16 | (2006.01) |
| H01L 29/36 | (2006.01) |
| H01L 29/40 | (2006.01) |
| H01L 29/66 | (2006.01) |

(52) U.S. Cl.
CPC .......... *H01L 29/872* (2013.01); *H01L 29/0619* (2013.01); *H01L 29/1608* (2013.01); *H01L 29/36* (2013.01); *H01L 29/402* (2013.01); *H01L 29/6606* (2013.01)

(58) Field of Classification Search
USPC ........................................................ 257/484
See application file for complete search history.

(56) References Cited

U.S. PATENT DOCUMENTS

| 4,476,157 A | 10/1984 | Shinozaki | |
|---|---|---|---|
| 2006/0151806 A1* | 7/2006 | Fukuda et al. | ................. 257/155 |
| 2009/0029518 A1* | 1/2009 | Souma | .......................... 438/328 |
| 2012/0146055 A1 | 6/2012 | Mitani et al. | |
| 2012/0205770 A1* | 8/2012 | Tung et al. | .................... 257/471 |
| 2015/0001554 A1 | 1/2015 | Imai | |

FOREIGN PATENT DOCUMENTS

| JP | S58-027374 A | 2/1983 |
|---|---|---|
| JP | S62-029164 A | 2/1987 |

(Continued)

OTHER PUBLICATIONS

An Office Action issued by the Korean Patent Office on Sep. 15, 2015, which corresponds to Korean Patent Application No. 10-2014-0100231 and is related to U.S. Appl. No. 14/290,253; with English language partial translation.

*Primary Examiner* — Khaja Ahmad
(74) *Attorney, Agent, or Firm* — Studebaker & Brackett PC

(57) ABSTRACT

A silicon carbide semiconductor device includes: a drift layer of the a first conduction type; a guard ring region of a second conduction type formed in annular form in a portion of one surface of the drift layer; a field insulating film formed on the one surface of the drift layer and surrounding the guard ring region; a Schottky electrode covering the guard ring region and the drift layer exposed inside the guard ring region and having an outer peripheral end existing on the field insulating film; and a surface electrode pad on the Schottky electrode, wherein an outer peripheral end of the surface electrode pad comes into contact with the field insulating film over the outer peripheral end of the Schottky electrode.

15 Claims, 5 Drawing Sheets

(56) References Cited

FOREIGN PATENT DOCUMENTS

| JP | 2005-286197 A | 10/2005 |
|---|---|---|
| JP | 2006-324585 A | 11/2006 |
| JP | 2008-251772 A | 10/2008 |
| JP | 2009-032909 A | 2/2009 |
| JP | 2012-124268 A | 6/2012 |
| JP | 2012-124329 A | 6/2012 |
| JP | 2013-211503 A | 10/2013 |

* cited by examiner

SILICON CARBIDE SEMICONDUCTOR DEVICE

BACKGROUND OF THE INVENTION

1. Field of the Invention

The present invention relates to a silicon carbide semiconductor device having a Schottky junction and, more particularly, to a silicon carbide semiconductor device in which part of a Schottky electrode forming a Schottky junction is in contact with a terminal region such as a guard ring, and in which an outer peripheral end of the Schottky electrode is on an insulating film.

2. Background Art

Since a Schottky barrier diode (SBD) is a unipolar device, it is capable of reducing its switching loss compared with an ordinary bipolar diode. However, the withstand voltages of available practical SBDs having silicon as their constituent materials are about 50 V at the maximum. Therefore, SBDs having silicon as their constituent materials are not suitable for use in high-voltage inverters or the like. In contrast, SBDs having silicon carbide as their constituent materials and easily having a withstand voltage of about several kilovolts can be obtained. Applications to electric power conversion circuits of SBDs having silicon carbide as their constituent materials have therefore attracted attention in recent years.

As such an SBD having silicon carbide as its constituent material, a device such as described in Japanese Patent Laid-Open No. 2005-286197 (FIG. 1) for example is known. In the SBD disclosed in Japanese Patent Laid-Open No. 2005-286197 (FIG. 1), an overlay structure in which a Schottky electrode is extended over the outer peripheral end of a guard ring region is provided in order to extend a depletion layer produced around a PN junction between the guard ring region and an n-type semiconductor layer at the time of static application of a high voltage. Use of such a structure enables the depletion layer to extend easily in the n-type semiconductor layer, so that this SBD has high voltage blocking ability.

SUMMARY OF THE INVENTION

With such an SBD made to perform a high-frequency switching operation, there is an apprehension that electric field concentration can occur in the vicinity of the outer peripheral end of the Schottky electrode to cause withstand voltage degradation of the SBD.

That is, in the switching operation making a transition from a conducting state to a blocking state, an abruptly rising voltage, i.e., a high-dv/dt voltage, is applied to the SBD. At this time, a displacement current proportional to the value of dv/dt flows in the guard ring region of the SBD to charge the PN junction between the guard ring region and the n-type semiconductor layer. The guard ring region has a specific resistance value. When the displacement current proportional to the value of dv/dt flows, an electric field proportional to the displacement current is generated in the guard ring region.

In the conventional SBD, the Schottky electrode overlay structure is adopted. At the outer peripheral end of the Schottky electrode, an etching residue occurs in a shape having a sharpened extreme end when the Schottky electrode is formed by etching. When the SBD performs a high-frequency switching operation in a situation where such a Schottky electrode residue sharpened at its extreme end exists, an electric field generated by a displacement current can concentrate easily at the residue portion. There is an apprehension that the concentration of the electric field can result in a fault in the vicinity of the outer peripheral end of the Schottky electrode.

In view of the above-described problems, an object of the present invention is to provide a silicon carbide semiconductor device having improved reliability even in high-frequency switching operation.

According to the present invention, a silicon carbide semiconductor device includes: a drift layer of the a first conduction type; a guard ring region of a second conduction type formed in annular form in a portion of one surface of the drift layer; a field insulating film formed on the one surface of the drift layer and surrounding the guard ring region; a Schottky electrode covering the guard ring region and the drift layer exposed inside the guard ring region and having an outer peripheral end existing on the field insulating film; and a surface electrode pad on the Schottky electrode, wherein an outer peripheral end of the surface electrode pad comes into contact with the field insulating film over the outer peripheral end of the Schottky electrode.

The present invention makes it possible to provide a silicon carbide semiconductor device having improved reliability even in high-frequency switching operation.

Other and further objects, features and advantages of the invention will appear more fully from the following description.

DETAILED DESCRIPTION OF THE PREFERRED EMBODIMENTS

First Embodiment

Figure 1A:
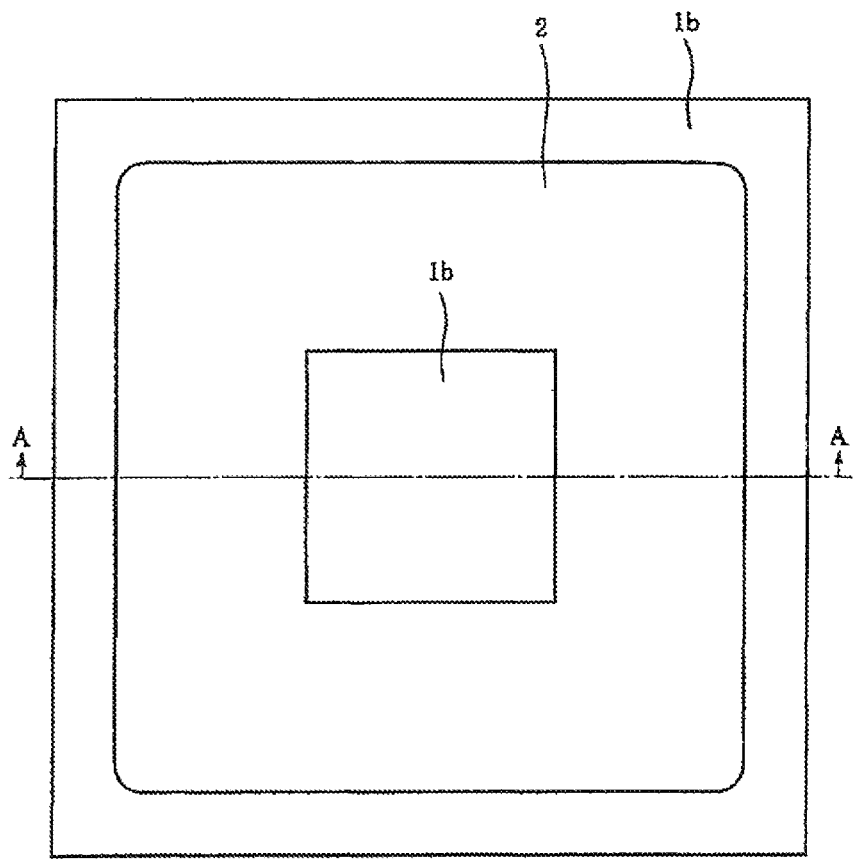
FIG. 1A is a schematic plan view of the construction of a silicon carbide semiconductor device chip according to a first embodiment of the present invention.
Figure 1B:
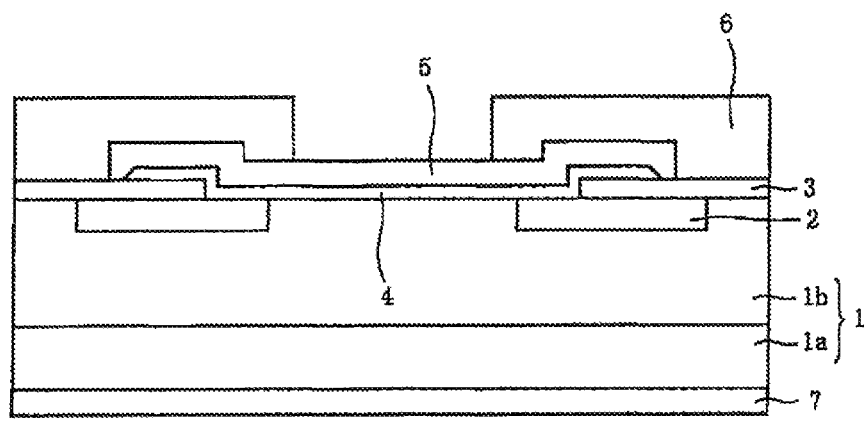
FIG. 1B is a sectional view of the chip taken along line A-A.

FIG. 1A is a schematic plan view of the construction of a silicon carbide semiconductor device chip according to a first embodiment of the present invention. FIG. 1B is a sectional view of the chip taken along line A-A. FIGS. 1A and 1B show an example of the device having an SBD provided as a semiconductor element on a silicon carbide substrate 1. FIG. 1A shows, for ease of explanation, only components necessary for understanding positional relationships on the silicon carbide substrate 1 as seen in plan. For details, reference should be made to FIG. 1B.

As shown in FIG. 1B, the silicon carbide semiconductor device according to the present embodiment is formed by using a silicon carbide substrate 1 formed of a substrate layer 1a of a first conduction type (n-type in this example) having a comparatively high impurity concentration and a drift layer 1b of the first conduction type having a comparatively low impurity concentration and epitaxially grown on an upper surface of the substrate layer 1a. Silicon carbide as the material of the substrate is a semiconductor material having a band gap wider than that of silicon. Therefore, the semiconductor device having silicon carbide as its constituent material can operate at a higher temperature compared with a semiconductor device having silicon as its constituent material.

A guard ring region 2 of a second conduction type (p-type in this example) that is a terminal region is formed in annular form in a portion of one surface of the drift layer 1b. Inside and outside the guard ring region 2 formed in annular form, the drift layer 1b is exposed at the one surface. The guard ring region 2 forms a PN junction with the drift layer 1b. A field insulating film 3 is further formed on the one surface of the drift layer 1b so as to surround the guard ring region 2. The field insulating film 3 has an opening at its center. In the present embodiment, the field insulating film 3 is silicon oxide film. The field insulating film 3 may alternatively be silicon nitride film.

A Schottky electrode 4 is formed so as to cover the drift layer 1b exposed inside the guard ring region 2 formed in annular form. The Schottky electrode 4 forms a Schottky junction with the drift layer 1b. The Schottky electrode 4 extends so as to cover part of the guard ring region 2, and forms an ohmic contact with the guard ring region 2. Further, the Schottky electrode 4 also extends on the field insulating film 3, and its outer peripheral end exists on the field insulating film 3. In the present embodiment, a metal that forms the Schottky electrode 4 is titanium and the thickness of the Schottky electrode 4 is about 200 nm. Any other metal that can form a Schottky junction with the silicon carbide substrate suffices as the metal forming the Schottky electrode 4 and may be molybdenum, nickel or gold, for example.

A surface electrode pad 5 for connection to an external terminal is layered on the Schottky electrode 4. The surface electrode pad 5 comes into contact with the field insulating film 3 over the outer peripheral end of the Schottky electrode 4. In the present embodiment, a metal that forms the surface electrode pad 5 is aluminum and the thickness of the surface electrode pad 5 is about 4.8 μm. The metal that forms the surface electrode pad 5 may alternatively be molybdenum, nickel, or the like, or an aluminum alloy such as Al—Si.

A protective film 6 is provided over the one surface of the silicon carbide substrate 1, on which the field insulating film 3, the Schottky electrode 4 and the surface electrode pad 5 are formed, so as to protect the field insulating film 3, the Schottky electrode 4 and the surface electrode pad 5. Preferably, the protective film 6 is an organic resin film for moderating stress from an external environment. In the present embodiment, a polyimide resin film is used as protective film 6 because of a need to withstand a high-temperature treatment. The protective film 6 has on the surface electrode pad 5 an opening for connection to the external terminal.

A back electrode 7 is formed on the other surface of the silicon carbide substrate 1. The back electrode 7 forms an ohmic contact with the substrate layer 1a. A metal that can form an ohmic contact with the substrate layer 1a suffices as the metal forming the back electrode 7. In the present embodiment, this metal is nickel. Aluminum or molybdenum may alternatively be used as this metal.

A method of manufacturing the silicon carbide semiconductor device according to the present embodiment will be described with reference to FIGS. 4A-4C and 5A-5C. Each of FIGS. 4A-4C and 5A-5C shows a section taken along line A-A in FIG. 1.

Figure 4A:
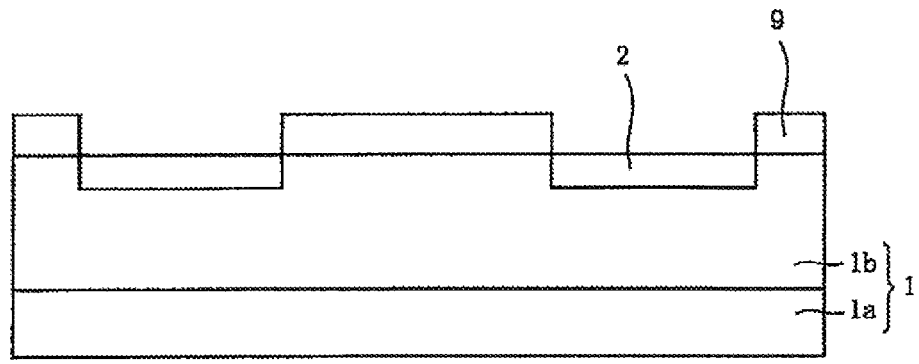
FIGS. 4A-4C and 5A-5C are sectional views describing a method of manufacturing the silicon carbide semiconductor device according to the embodiment.

The silicon carbide substrate 1 formed of the first conduction type of substrate layer 1a having a comparatively high impurity concentration and the first conduction type of drift layer 1b having a comparatively low impurity concentration and epitaxially grown on the upper surface of the substrate layer 1a is prepared. The second conduction type of guard ring region 2 is formed on a portion of the one surface of the drift layer 1b by selective ion implantation using a resist film 9 formed into a predetermined shape by patterning based on a well-known method, e.g., a photomechanical technique (FIG. 4A). In the second conduction type of region, aluminum ions or boron ions, for example, are injected as impurity ions. The impurity ions are electrically activated by annealing performed at a high-temperature of 1500° C. or higher, thereby forming the predetermined conduction type of region.

Figure 4B:
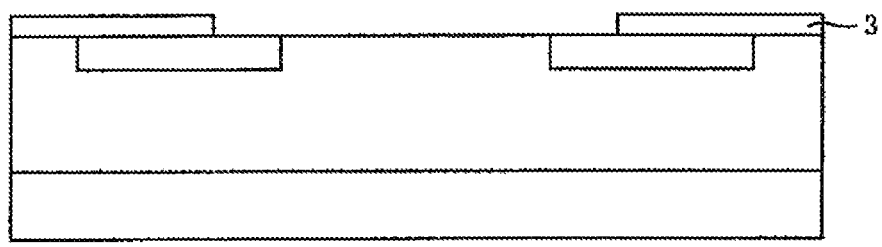

Next, silicon oxide film having a thickness of about 1 μm is deposited on the one surface of the drift layer 1b, for example, by chemical vapor deposition (CVD). A central silicon oxide film portion is thereafter removed by a photomechanical process and etching, thereby forming the field insulating film 3 having an opening at the center (FIG. 4B). The opening is formed inside the guard ring region 2 and includes a portion of the guard ring region 2.

Figure 4C:
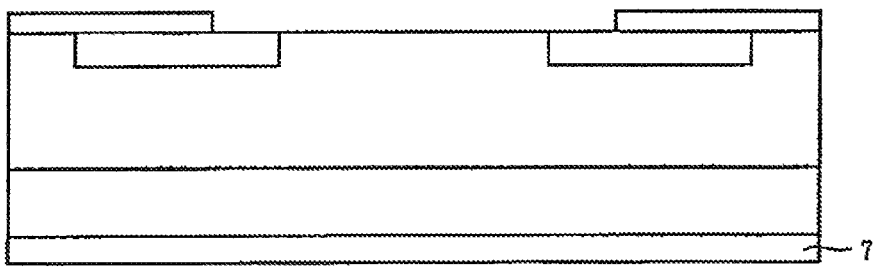

Next, the back electrode 7 is formed on the surface of the silicon carbide substrate 1 at which the substrate layer 1a is exposed (FIG. 4C).

Figure 5A:
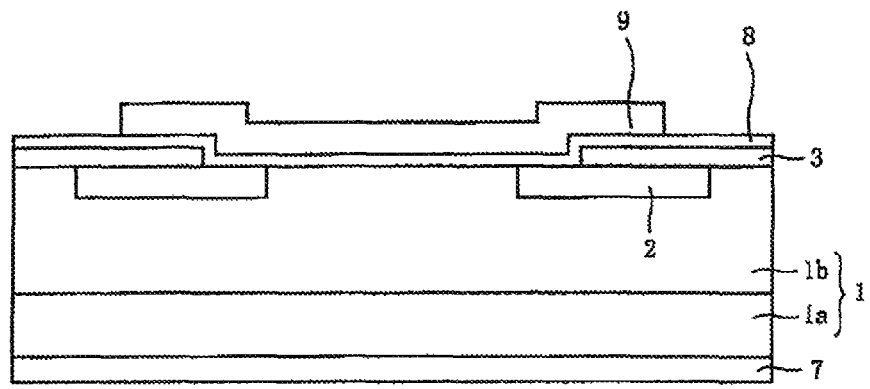

Next, a metal film 8 to be formed into the Schottky electrode 4 is formed by sputtering over the entire area of the one surface of the drift layer 1b on which the field insulating film 3 is formed, and the resist film 9 is formed into the predetermined shape by the photomechanical technique (FIG. 5A).

Figure 5B:
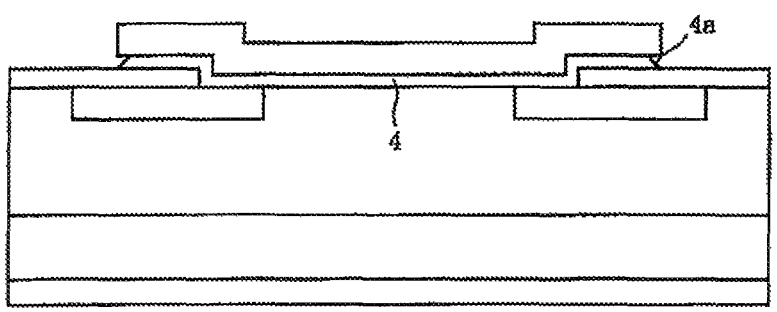

The metal film 8 is then etched with the resist film 9 used as a mask, thereby forming the Schottky electrode 4 having the desired shape (FIG. 5B). In etching of the metal film 8, it is desirable to perform a wet treatment in order to reduce damage to the chip. An end portion of the Schottky electrode 4 formed in such a case tends to be sharpened in shape at its extreme end. This sharpened extreme end portion will hereinafter be referred to as an etching residue 4a.

Figure 5C:
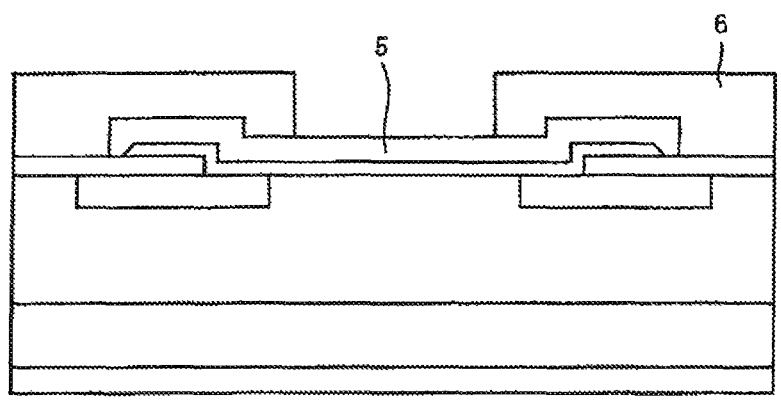

Next, the surface electrode pad 5 is laid on the Schottky electrode 4 so as to cover the etching residue 4a, thereby forming the protective film 6. The silicon carbide semiconductor device according to the present embodiment is thus completed (FIG. 5C).

Next, the operation of the silicon carbide semiconductor device according to the present embodiment will be described. In the silicon carbide semiconductor device according to the present embodiment, when a negative voltage is applied to the back electrode 7 with respect to the surface electrode pad 5, the semiconductor device becomes conductive, such that a current flows from the back electrode 7 to the surface electrode pad 5. Conversely, when a positive voltage is applied to the back electrode 7 with respect to the surface electrode pad 5, the semiconductor device enters a blocking state, such that the Schottky junction and the PN junction block the current.

At the time of switching operation, i.e., a transition from the conducting state to the blocking state, an abruptly rising voltage, i.e., a high-dv/dt voltage, is applied to the device. At this time, an electric double layer called a depletion layer is produced around the PN junction between the guard ring region and the n-type semiconductor layer. This depletion layer has an electrostatic capacity called a depletion layer capacity. To charge this depletion layer capacity, a displacement current proportional to the value of dv/dt flows in the guard ring region 2 of the device from the PN junction toward the Schottky electrode 4. The guard ring region 2 has a specific resistance value. When the displacement current proportional to the value of dv/dt flows, an electric field proportional to the product of the displacement current and the resistance value is generated in the guard ring region 2.

If the etching residue 4a sharpened at its extreme end is left uncovered at the end of the Schottky electrode 4 as in the conventional device, there is a possibility of equipotential surfaces formed by the electric field generated in the guard ring region 2 being bent on the periphery around the etching residue 4a to cause electric field concentration at this portion.

The silicon carbide semiconductor device according to the present embodiment is constructed so that the outer peripheral end of the surface electrode pad 5 comes into contact with the field insulating film 3 over the outer peripheral end of the Schottky electrode 4. Accordingly, the etching residue 4a at the end of the Schottky electrode 4 is covered with the surface electrode pad 5 having electrical conductivity. Therefore, equipotential surfaces formed by the electric field generated in the guard ring region 2 by the displacement current are not bent on the periphery around the etching residue 4a. As a result, there is substantially no possibility of electric field concentration at this portion.

Thus, the present embodiment demonstrates that a silicon carbide semiconductor device having improved reliability even in high-frequency switching operation can be obtained.

It is desirable that the outer peripheral end of the surface electrode pad 5 exist above the guard ring region 2. This is because if an overlay structure is adopted as in the conventional examples in which the outer peripheral end of the surface electrode pad 5 has an overlay structure over the outer peripheral end of the guard ring region 2, there is a possibility of equipotential surfaces formed by the electric field generated in the guard ring region by the displacement current being bent by the surface electrode pad 5 existing over the outer peripheral end of the guard ring region 2 to cause withstand voltage degradation at the corresponding position. Thus, the construction in which the surface electrode pad 5 is placed as described above enables obtaining a silicon carbide semiconductor device having further improved reliability even in high-frequency switching operation.

Second Embodiment

Figure 2:
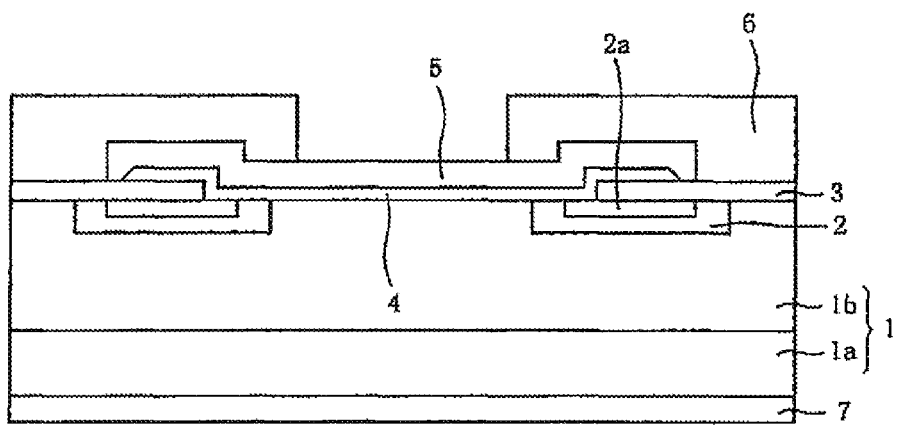
FIG. 2 is a schematic sectional view of the construction of a silicon carbide semiconductor device chip according to a second embodiment of the present invention.

FIG. 2 is a schematic sectional view of the construction of a silicon carbide semiconductor device chip according to a second embodiment of the present invention. The construction of the device as viewed in plan is the same as that in FIG. 1, and illustration of the device in plan is therefore omitted. The present embodiment is characterized in that a p-type high-concentration region 2a having an impurity concentration higher than that in the guard ring region 2 is formed in the guard ring region 2 from a surface of the same. In other respects, the construction is the same as that in the first embodiment.

The construction described above inhibits extension of the depletion layer into the high-concentration region 2a. Therefore, the resistance value specific to the guard ring region 2 can be reduced and the electric field generated in proportion to the resistance value can be moderated. Thus, the present embodiment demonstrates that a silicon carbide semiconductor device having higher reliability even in high-frequency switching operation can be obtained.

Third Embodiment

Figure 3:
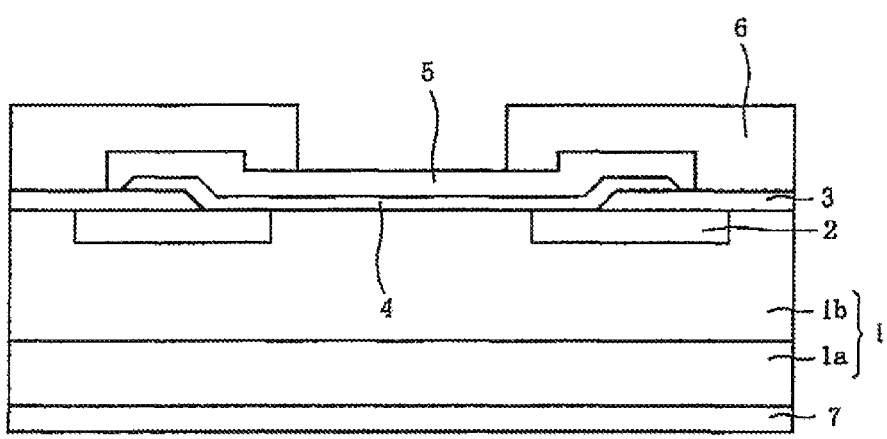
FIG. 3 is a schematic sectional view of the construction of a silicon carbide semiconductor device chip according to a third embodiment of the present invention.

FIG. 3 is a schematic sectional view of the construction of a silicon carbide semiconductor device chip according to a third embodiment of the present invention. The construction of the device as viewed in plan is the same as that in FIG. 1, and illustration of the device in plan is therefore omitted. The present embodiment is characterized in that the opening in the field insulating film 3 is tapered. In other respects, the construction is the same as that in the first embodiment.

More specifically, the opening in the field insulating film 3 has a tapered shape such that the thickness of the field insulating film 3 is larger at a position remoter from the boundary on the opening in an outward direction. The opening in the field insulating film 3 is tapered to more moderate the electric field at the end of the Schottky electrode 4, thereby further improving the reliability of the chip. Thus, the present embodiment demonstrates that a silicon carbide semiconductor device having higher reliability even in high-frequency switching operation can be obtained.

Figure 6:
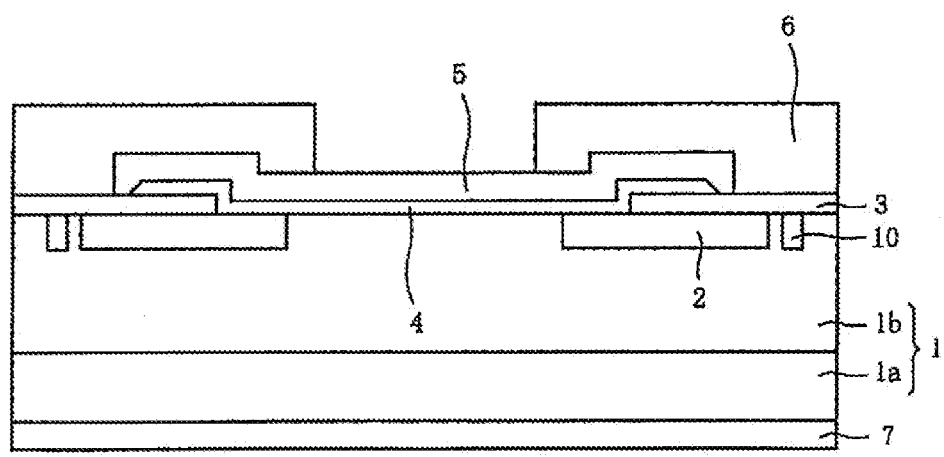
FIG. 6 is a sectional view of the construction of a modification example of a silicon carbide semiconductor device chip according to the embodiment.

In the above description of the embodiments, the construction in which the semiconductor element is an SBD and the guard ring region 2 is provided as a terminal region has been described. However, the semiconductor element and the structure of the terminal region of a silicon carbide semiconductor device according to the present invention are not limited to those in the described construction. For example, the semiconductor element may alternatively be a junction barrier Schottky diode (JBS) having the same Schottky junction or a merged PiN Schottky diode (MPS), and a junction termination extension (JTE) may be provided in place of the guard ring region 2 as a terminal region. A field limiting ring 10 may be also provided in addition to the guard ring region 2, as shown in FIG. 6. While the first and second conduction types are assumed to be the n-type and the p-type, respectively, the first and second conduction types may conversely be the p-type and the n-type, respectively. Needless to say, the functions and advantages of the present invention can also be attained when the conduction types are reversed.

If the silicon carbide semiconductor device according to the present invention is applied to an apparatus for power conversion such as conversion of an alternating current into a direct current, conversion of a direct current into an alternating current or frequency conversion, it can contribute to an improvement in power conversion efficiency of the apparatus.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-176954, filed on Aug. 28, 2013 including specification, claims, drawings and summary, on which the Convention priority of the present application is based, is incorporated herein by reference in its entirety.

What is claimed is:

1. A silicon carbide semiconductor device comprising:
   a drift layer of a first conduction type;
   a guard ring region of a second conduction type formed in annular form in a portion of one surface of the drift layer in a peripheral region of the silicon carbide semiconductor device;
   a field insulating film formed on the one surface of the drift layer and surrounding the guard ring region, the field insulating film including an innermost edge;
   a Schottky electrode covering the guard ring region and the drift layer exposed inside the guard ring region and having an outermost edge existing on the field insulating film; and
   a surface electrode pad on the Schottky electrode having an outermost edge, wherein
   the outermost edge of the surface electrode pad comes into contact with the field insulating film covering the outermost edge of the Schottky electrode in the peripheral region of the silicon carbide semiconductor device,
   the outermost edge of the surface electrode pad exists directly above the guard ring region, and
   in the peripheral region of the silicon carbide semiconductor device, a distance from the outermost edge of the Schottky electrode to the outermost edge of the surface electrode pad is less than a distance from the innermost edge of the field insulating film to the outermost edge of the Schottky electrode.

2. The silicon carbide semiconductor device according to claim 1, further comprising a high-concentration region of the second conduction type having an impurity concentration higher than an impurity concentration in the guard ring region and formed in the guard ring region from a surface of the guard ring region.

3. The silicon carbide semiconductor device according to claim 1, wherein an opening in the field insulating film is tapered.

4. The silicon carbide device according to claim 1, further comprising:
   a field limiting ring disposed on a peripheral area of the guard ring.

5. The silicon carbide device according to claim 1, wherein the Schottky electrode and the surface electrode pad cover a majority of the guard ring region.

6. A silicon carbide semiconductor device comprising:
   a drift layer of a first conduction type;
   a guard ring region of a second conduction type formed in annular form in a portion of one surface of the drift layer;
   a field insulating film formed on the one surface of the drift layer and surrounding the guard ring region;
   a Schottky electrode covering the guard ring region and the drift layer exposed inside the guard ring region and having an outermost edge existing on the field insulating film;
   a surface electrode pad on the Schottky electrode having an outermost edge; and
   a high-concentration region of the second conduction type having an impurity concentration higher than an impurity concentration in the guard ring region and formed in the guard ring region from a surface of the guard ring region, wherein
   the outermost edge of the surface electrode pad comes into contact with the field insulating film covering the outermost edge of the Schottky electrode,
   the outermost edge of the Schottky electrode exists directly above the high-concentration region, and
   the outermost edge of the surface electrode pad exists directly above the guard ring region.

7. The silicon carbide semiconductor device according to claim 6, wherein an opening in the field insulating film is tapered.

8. The silicon carbide device according to claim 6, further comprising:
   a field limiting ring disposed on a peripheral area of the guard ring.

9. The silicon carbide device according to claim 6, wherein the Schottky electrode and the surface electrode pad cover a majority of the guard ring region.

10. A silicon carbide semiconductor device comprising:
    a drift layer of a first conduction type having an outermost edge;
    a second conduction type region formed in annular form in a portion of one surface of the drift layer and having an outermost edge in a peripheral region of the silicon carbide semiconductor device;
    a field insulating film formed on the one surface of the drift layer and surrounding the second conduction type region;
    a Schottky electrode covering the second conduction type region and the drift layer exposed inside the second conduction type region, the Schottky electrode having an outermost edge; and
    a surface electrode pad on the Schottky electrode having an outermost edge, wherein
    the outermost edge of the surface electrode pad comes into contact with the field insulating film covering the outermost edge of the Schottky electrode in the peripheral region of the silicon carbide semiconductor device,
    the outermost edge of the surface electrode pad exists directly above the second conduction type region in the peripheral region of the silicon carbide semiconductor device, and
    in the peripheral region of the silicon carbide semiconductor device, a distance from the outermost edge of the drift layer to the outermost edge of the second conduction type region is more than a distance from the outermost edge of the second conduction type region to the outermost edge of the surface electrode pad.

11. The silicon carbide semiconductor device according to claim 10, further comprising:
    a field limiting ring disposed on a peripheral area of the second conduction type region.

12. The silicon carbide semiconductor device according to claim 10, further comprising a high-concentration region of the second conduction type having an impurity concentration higher than an impurity concentration in the second conduction type region and formed in the second conduction type region from a surface of the second conduction type region.

13. The silicon carbide semiconductor device according to claim 10, wherein an opening in the field insulating film is tapered.

14. The silicon carbide device according to claim 10, wherein the Schottky electrode and the surface electrode pad cover a majority of the second conduction type region.

15. The silicon carbide device according to claim 10, wherein the second conduction type region includes a junction termination extension.

* * * * *